United States Patent
Sato et al.

(10) Patent No.: US 7,446,061 B2
(45) Date of Patent: Nov. 4, 2008

(54) METHOD OF FORMING INSULATING FILM, METHOD OF MANUFACTURING SEMICONDUCTOR DEVICE AND THEIR CONTROLLING COMPUTER PROGRAM

(75) Inventors: Hiroshi Sato, Kanagawa-ken (JP);
Rempei Nakata, Kanagawa-ken (JP);
Yukio Nishiyama, Kanagawa-ken (JP);
Taketo Matsuda, Kanagawa-ken (JP)

(73) Assignee: Kabushiki Kaihsa Toshiba, Tokyo (JP)

( * ) Notice: Subject to any disclaimer, the term of this patent is extended or adjusted under 35 U.S.C. 154(b) by 160 days.

(21) Appl. No.: 11/633,484

(22) Filed: Dec. 5, 2006

(65) Prior Publication Data
US 2007/0128865 A1     Jun. 7, 2007

(30) Foreign Application Priority Data
Dec. 6, 2005    (JP)    ............................ P2005-352498

(51) Int. Cl.
H01L 21/44   (2006.01)
H01L 21/31   (2006.01)
(52) U.S. Cl. ................ 438/788; 438/758; 257/E21.279
(58) Field of Classification Search ................. 438/758, 438/788
See application file for complete search history.

(56) References Cited
U.S. PATENT DOCUMENTS

| | | | |
|---|---|---|---|
| 6,596,653 B2 | 7/2003 | Tan et al. | |
| 6,596,654 B1 | 7/2003 | Bayman et al. | |
| 7,288,205 B2* | 10/2007 | Lakshmanan et al. | .......... 216/67 |
| 2004/0038545 A1* | 2/2004 | Cheung et al. | .............. 438/709 |
| 2004/0152338 A1* | 8/2004 | Gaillard et al. | ............. 438/778 |
| 2005/0260864 A1* | 11/2005 | Huang et al. | ................ 438/792 |

* cited by examiner

*Primary Examiner*—Alexander G Ghyka
(74) *Attorney, Agent, or Firm*—Finnegan, Henderson, Farabow, Garrett, & Dunner, L.L.P.

(57) ABSTRACT

A semiconductor substrate with a groove is placed in a plasma generating reaction chamber. Silicon, oxygen and hydrogen containing gases are introduced into the reaction chamber as process gases. A ratio of a gas flow of the hydrogen containing gas except the silicon containing gas to a total gas flow of the silicon containing gas and the oxygen containing gas defines a first gas-flow ratio. A ratio of a gas flow of the oxygen containing gas to that of the silicon containing gas defines a second gas-flow ratio. The first and second gas-flow ratios establish a linear function for a critical condition. A cluster formation condition is set up by relatively increasing the first gas-flow ratio while relatively decreasing the second gas-flow ratio with respect to the critical condition. A cluster suppression condition is also set up by relatively decreasing the first gas-flow ratio while relatively increasing the second gas-flow ratio with respect to the critical condition. The process gases are supplied to the reaction chamber under the cluster formation condition and under the cluster suppression condition, alternately, to form an insulating film buried in the groove.

20 Claims, 14 Drawing Sheets

PRIOR ART FIG. 2

METHOD OF FORMING INSULATING FILM, METHOD OF MANUFACTURING SEMICONDUCTOR DEVICE AND THEIR CONTROLLING COMPUTER PROGRAM

CROSS-REFERENCE OF RELATED APPLICATIONS

This application is based upon and claims the benefit of priority from the prior Japanese Patent Application No. 2005-352498, filed on Dec. 6, 2005, the entire contents of which are incorporated herein by reference.

FIELD OF THE INVENTION

This invention generally relates to a method of forming an insulating film, a method of manufacturing a semiconductor device and their controlling computer program.

BACKGROUND OF THE INVENTION

A high-density plasma chemical vapor deposition (HDP-CVD) technique is generally adopted for depositing an insulating film in a groove portion formed on a semiconductor substrate with 1.0 or more of a high aspect ratio (a ratio of a groove depth to an opening width), for example. In recent years, a hydrogen-molecule ($H_2$) added HDP-CVD technique has been employed. Adding $H_2$ in deposition makes it possible to perform the deposition while suppressing opening blockage due to overhang in an upper portion of the groove. As a result, since the deposition can prevent formation of voids in an insulating film buried in the groove, the insulating film burying property in the groove can be improved.

Since miniaturization results in further heightening the aspect ratio to 3.0 or higher, for example, it is essential to add $H_2$ in the application of the HDP-CVD technique. However, a deoxidization by $H_2$ causes a deficiency of oxygen atoms in the insulating film to affect quality of the insulating film. Thus, it is difficult to simultaneously satisfy the requirements for both insulating film burying property and quality of the insulating film. Such conventional technique is disclosed in U.S. Pat. Nos. 6,596,653 and 6596,654.

SUMMARY OF THE INVENTION

One embodiment of the present invention is directed to a method of forming an insulating film to fill a gap formed in a processed substrate placed in a reaction chamber in which plasma is generated. The method is carried out by introducing first process gases including a silicon containing gas, an oxygen containing gas and a hydrogen containing gas into the reaction chamber under a cluster formation condition set up with respect to a critical condition and by introducing second process gases including an oxygen containing gas, and at least one of a silicon containing gas and a hydrogen containing gas into the reaction chamber under a cluster suppression condition set up with respect to the critical condition. In the method, a ratio of a gas flow of the hydrogen containing gas except the silicon containing gas to a total gas flow of the silicon containing gas and the oxygen containing gas defines a first gas-flow ratio. Also, a ratio of a gas flow of the oxygen containing gas to that of the silicon containing gas defines a second gas-flow ratio. The critical condition is a linear function defined by the first and second gas-flow ratios. The cluster formation condition is set by gas flows which relatively increase the first gas-flow ratio but relatively decrease the second gas-flow ratio. The cluster suppression condition is set by gas flows which relatively decrease the first gas-flow ratio but relatively increase the second gas-flow ratio.

A next embodiment of the present invention is directed to a method of manufacturing a semiconductor device which is carried out by making a groove in a semiconductor substrate, placing the semiconductor substrate in a reaction chamber where plasma is generated, and burying an insulating film in the groove. The insulating film is formed by introducing first process gases including a silicon containing gas, an oxygen containing gas and a hydrogen containing gas into the reaction chamber under a cluster formation condition set up with respect to a critical condition, and by introducing second process gases including an oxygen containing gas, and at least one of a silicon containing gas and a hydrogen containing gas into the reaction chamber under a cluster suppression condition set up with respect to the critical condition. In the method, a ratio of a gas flow of the hydrogen containing gas except the silicon containing gas to a total gas flow of the silicon containing gas and the oxygen containing gas defines a first gas-flow ratio. Also, a ratio of a gas flow of the oxygen containing gas to that of the silicon containing gas defines a second gas-flow ratio. The critical condition is a linear function defined by the first and second gas-flow ratios. The cluster formation condition is set by gas flows which relatively increase the first gas-flow ratio but relatively decrease the second gas-flow ratio. The cluster suppression condition, on the other hand, is set by gas flows which relatively decrease the first gas-flow ratio but relatively increase the second gas-flow ratio.

A further embodiment of the present invention is directed to a computer control program for a plasma chemical vapor deposition apparatus. The control program executes the operations of introducing first process gases including a silicon containing gas, an oxygen containing gas and a hydrogen containing gas into a reaction chamber under a cluster formation condition set up with respect to a critical condition, and introducing second process gases including an oxygen containing gas, and at least one of a silicon containing gas and a hydrogen containing gas into the reaction chamber under a cluster suppression condition set up with respect to the critical condition. In the computer control program, a ratio of a gas flow of the hydrogen containing gas except the silicon containing gas to a total gas flow of the silicon containing gas and the oxygen containing gas defines a first gas-flow ratio. Also, a ratio of a gas flow of the oxygen containing gas to that of the silicon containing gas defines a second gas-flow ratio. The critical condition is a linear function defined by the first and second gas-flow ratios. The cluster formation condition is set by gas flows which relatively increase the first gas-flow ratio but relatively decrease the second gas-flow ratio. The cluster suppression condition is set by gas flows which relatively decrease the first gas-flow ratio but relatively increase the second gas-flow ratio.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1:
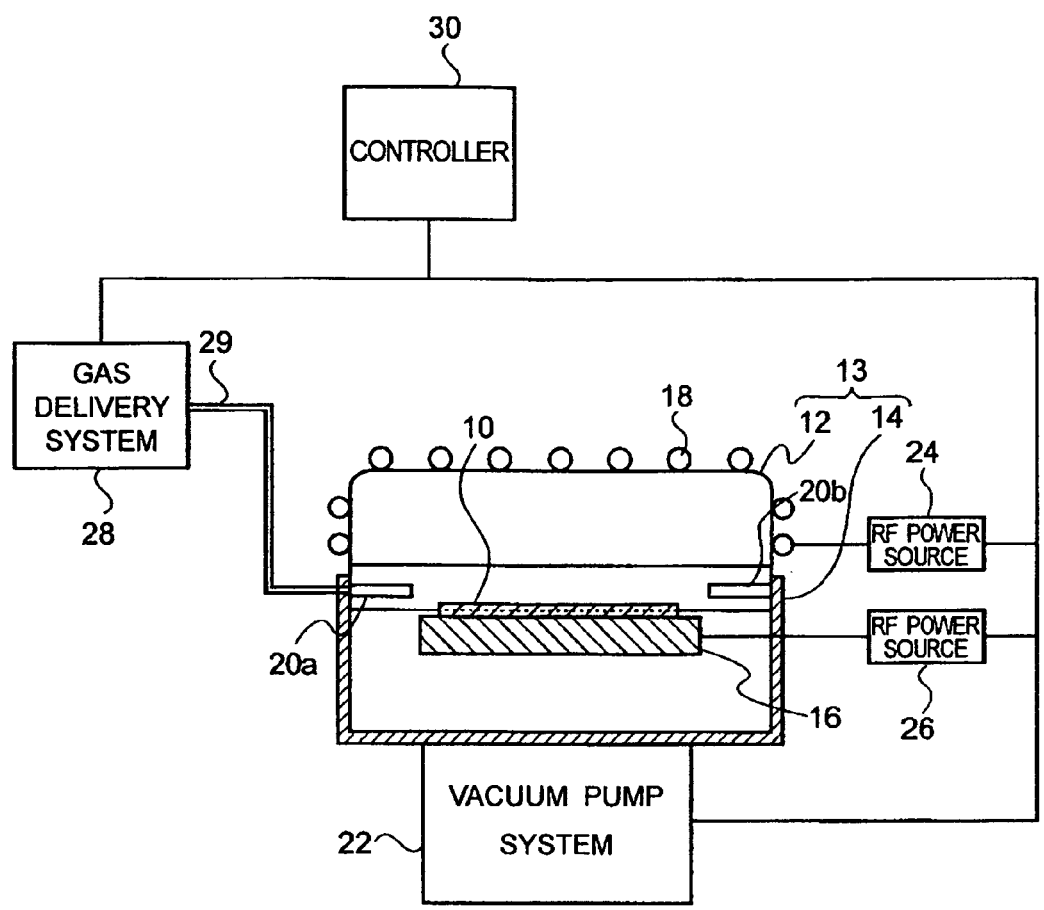
FIG. 1 is a schematic block diagram of a plasma chemical vapor deposition apparatus in which embodiments of the present invention are carried out.

Embodiments of the present invention will be explained below with reference to the attached drawings. It should be noted that the present invention is not limited to the embodiments but also covers their equivalents. Throughout the attached drawings, similar or same reference numerals show similar, equivalent or same components. The drawings, however, are shown schematically for the purpose of explanation, so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

EMBODIMENT

As shown in FIG. 1, a plasma chemical vapor deposition (PCVD) apparatus relating to an embodiment of the present invention is provided with reaction chamber 13, vacuum pump system 22, RF power supplies 24 and 26, gas delivery system 28, controller 30 and the like. Reaction chamber 13 includes metallic base portion 14 and ceramic dome portion 12 situated on base portion 14. Semiconductor substrate 10 is mounted on electrode 16 provided inside reaction chamber 13. High-density plasma (HDP) is generated in a region surrounded by a surface of semiconductor substrate 10 and dome portion 12.

Vacuum pump system 22 is for evacuating the reaction chamber 13 is connected to the bottom of base portion 14. Further, nozzles 20a and 20b are provided at upper portions of the base portion 14. Nozzles 20a and 20b are connected to gas delivery system 28 to supply process gases into a space inside dome portion 12 through supply line 29. The gas delivery system 28 is provided with gas sources for a silicon containing gas such as silane ($SiH_4$), disilane ($Si_2H_6$), or organic silane, an oxygen containing gas such as oxygen molecules ($O_2$), nitrogen monoxide (NO), or dinitrogen monoxide ($N_2O$), a hydrogen containing gas such as hydrogen molecules ($H_2$), water ($H_2O$), ammonium ($NH_3$), methane ($CH_4$), phosphine ($PH_3$), or diborane ($B_2H_6$), an inert gas such as helium (He), or argon (Ar), or any suitable substitute for the above gases. Additionally, gas delivery system 28 includes a flow meter, such as a mass flow controller (MFC), which is used for controlling supplies of the respective process gases.

Controller 30 controls the amounts of plural gases supplied from the gas delivery system 28 in response to a program describing CVD process conditions (processing recipes). Controller 30 also controls operations of both vacuum pump system 22 and RF power supplies 24 and 26.

Controller 30 includes and is controlled by dedicated hardware or an ordinary computer. The program is stored in a program memory (not illustrated) of controller 30. Further, it is possible to execute a series of operations in embodiments of the present invention under the program installed into the program memory of controller 30 from an outside source through a network or transferred to the program memory of controller 30 from a computer-readable recording medium. Here, the "computer-readable recording medium" means a medium capable of recording and reading a program, such as an external memory device for a computer, a semiconductor memory, a magnetic disc, an optical disc, a magneto-optical disc, and a magnetic tape. More specifically, a flexible disc, a CD-ROM, an MO disc and the like are included in the "computer-readable recording mediums." Controller 30 is connected to an input/output unit (not illustrated), which can read the medium and input values for each parameter in the program stored in the program memory to set specific CVD process conditions and output the same or the like.

Coiled antenna 18 is disposed on an outer wall of ceramic dome portion 12. Antenna 18 is connected to RF power supply 24. An RF power supplied to antenna 18 from RF power supply 24 is inductively coupled to a space inside ceramic dome portion 12 to generate plasma. Electrode 16 is connected to RF power supply 26. A bias power is supplied to electrode 16 from RF power supply 26, so that a self-bias voltage is applied between the plasma excited inside the ceramic dome portion 12 and semiconductor substrate 10 on electrode 16.

Figure 2:
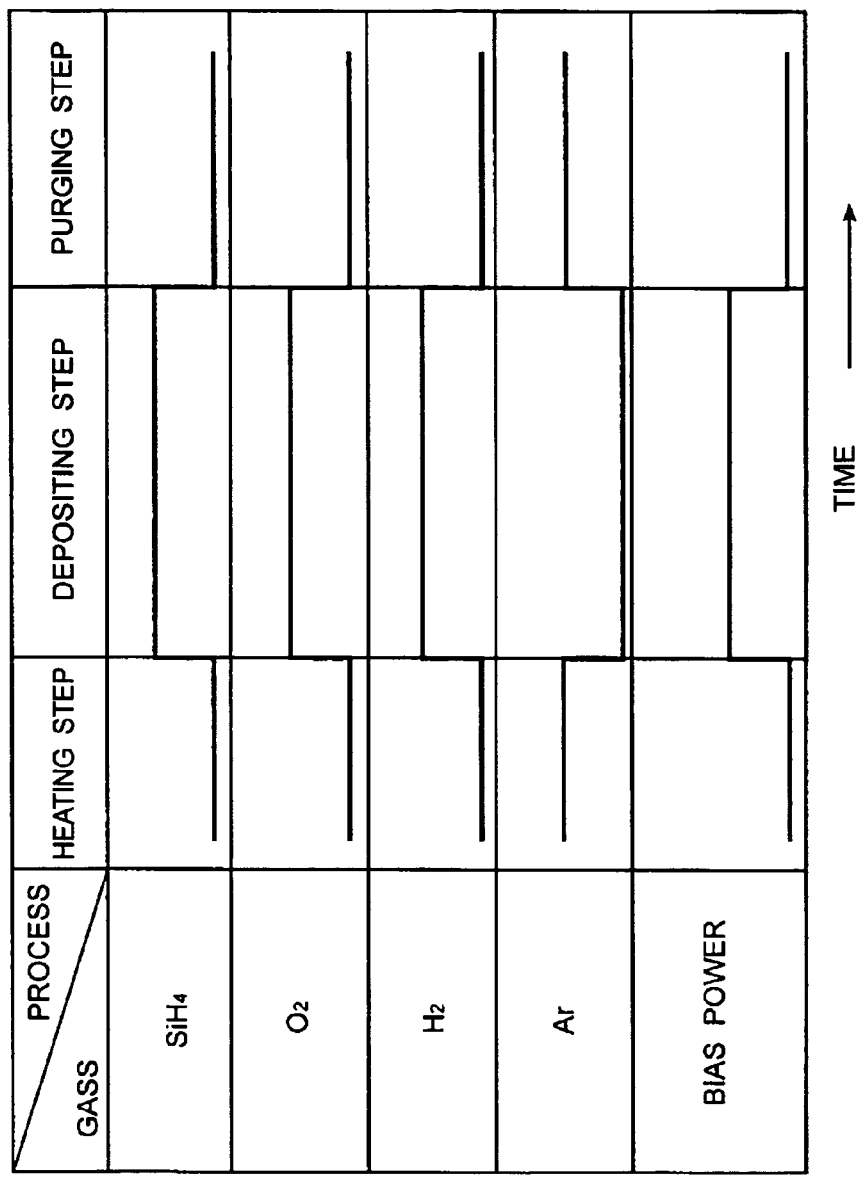
FIG. 2 is a chart of an example of a processing recipe used for a prior art HDP-CVD method.

Now, an explanation of a regular HDP-CVD process will be given below in the case that a silicon oxide ($SiO_2$) insulating film is buried in a device isolation groove formed on a surface of semiconductor substrate 10. The program memory of controller 30 stores a program for executing heating, depositing and purging steps in a processing recipe for the HDP-CVD process as schematically shown in FIG. 2. In the program, process conditions such as flow-rate conditions of process gases and application conditions of bias powers and plasma-excitation RF powers (not illustrated) for each of the steps are written as parameters. Specifically, horizontal and vertical axes of the processing recipe shown in FIG. 2 represent periods of time for heating, depositing and purging steps and magnitudes of process gases and a bias power, respectively.

Figure 3:
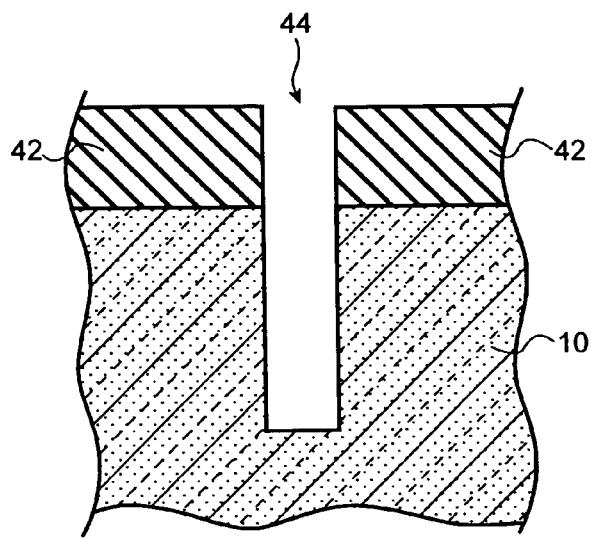
FIG. 3 is a sectional view of a semiconductor substrate used for HDP-CVD methods.

As shown in FIG. 3, a mask pattern for groove formation is transferred on silicon nitride ($Si_3N_4$) protective film 42 deposited on Si semiconductor substrate 10 by photolithography or the like. Reactive ion etching (RIE) is applied to form device isolation groove 44 with an aspect ratio of approximately 3.0 or higher, for example.

Semiconductor substrate 10 with groove 44 is then mounted on electrode 16 in reaction chamber 13 in the PCVD apparatus. Controller 30 controls flow rates of process gases, bias power, RF power, or the like as dictated in the program read out from the program memory in the following manner.

In the heating step, Ar gas is introduced into reaction chamber 13 from gas delivery system 28 through supply line 29 via nozzles 20a and 20b. An RF power is supplied to antenna 18 from RF power supply 24, so that Ar plasma generated inside the dome portion 12 heats semiconductor device 10.

The supply of Ar gas, however, is stopped in the depositiing step. Subsequently, $SiH_4$, $O_2$ and $H_2$ gases, for example, are supplied to reaction chamber 13 at approximate flow rates of 10 sccm, 22 sccm and 700 sccm, respectively. Further, a bias power at about 2 to 3 kW is applied to electrode 16 from RF power supply 26. A plasma-excitation RF power is supplied to antenna 18 from RF power supply 24.

In the purging step, the supply of $SiH_4$, $O_2$ and $H_2$ gases, the bias power and the plasma-excitation RF power is stopped. Ar gas is introduced to purge the inside of reaction chamber 13.

Figure 4:
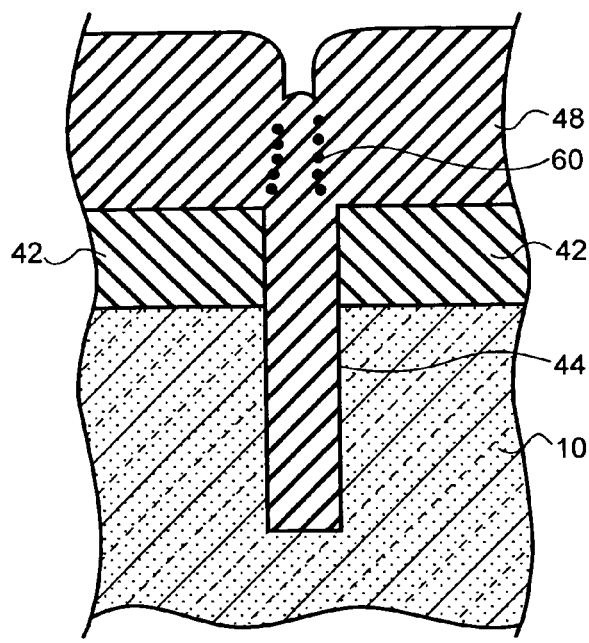
FIG. 4 is a sectional view of a semiconductor substrate on which an insulating film is deposited by a prior HDP-CVD method.

A cross section of semiconductor substrate 10 with an insulating film of $SiO_2$ or the like deposited by the HDP-CVD process has been assessed with a scanning electron microscope (SEM). As a result, the formation of voids has not been observed in insulating film 48 buried in groove 44 as shown in FIG. 4. However, oxygen atoms in insulating film 48 have been deficient due to a deoxidization action of $H_2$ during the deposition, so that the formation of Si clusters 60 is observed above protective film 42 in insulating film 48 as shown in FIG. 4.

The formation of Si clusters 60 deteriorates the insulating property of insulating film 48. Further, it becomes difficult to carry out a subsequent chemical-mechanical-polishing (CMP) process for portions of insulating film 48 where Si clusters 60 are formed, so that insulating film 48 cannot be planarized.

Figure 5:
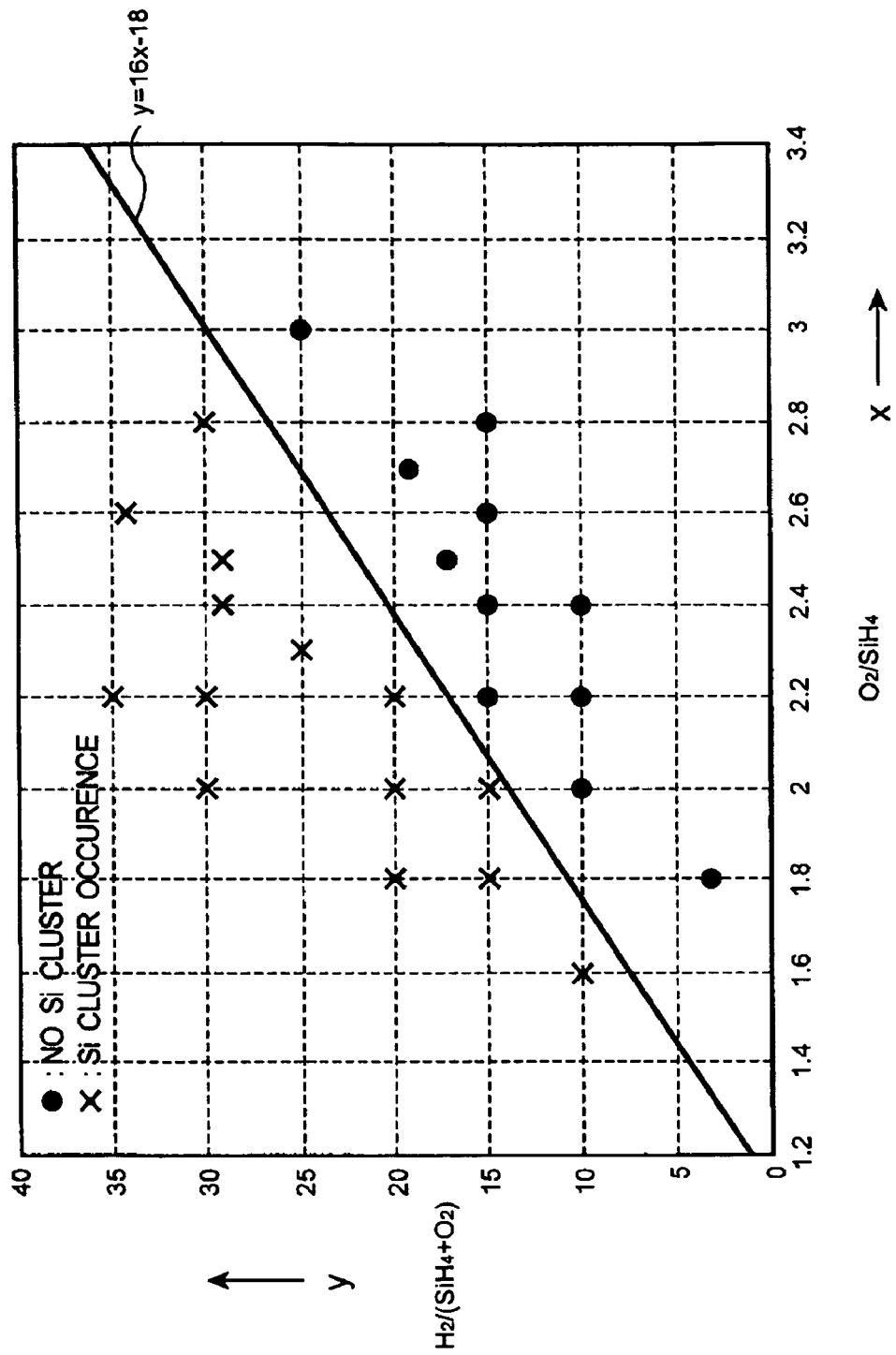
FIG. 5 is a graph of a gas-flow-ratio relationship to explain a method of forming an insulating film in accordance with embodiments of the present invention.

The inventors of the present invention have deposited an insulating film in accordance with various flow rates of the respective gases of $SiH_4$, $O_2$ and $H_2$ for the purpose of assessing the formation of Si cluster 60. As a result, as shown in FIG. 5, they have found critical condition y=16x−18 where the first and the second gas-flow ratios are $H_2/(SiH_4+O_2)$ and $O_2/SiH_4$ denoted on the y-axes and x-axes, respectively. Thus, the critical condition indicates a linear function defined between the first and second gas-flow ratios y and x. The critical condition separates a cluster formation condition on which Si clusters are formed from a cluster suppression condition on which the formation of Si clusters are suppressed.

In other words, under the present invention, the cluster formation condition on which the Si clusters are formed can be expressed as the following inequality:

$$y \geq 16x-18. \tag{1}$$

Under the cluster formation condition, although the Si clusters are formed, the groove-burying property is so high that the formation of voids is suppressed.

The cluster suppression condition on which formation of the Si clusters are suppressed, however, can be expressed as the following inequality:

$$y < 16x-18 \tag{2}$$

Under the cluster suppression condition, although the formation of the Si clusters is suppressed, the groove-burying property is deteriorated, so that the probability of formation of voids becomes higher.

Figure 6:
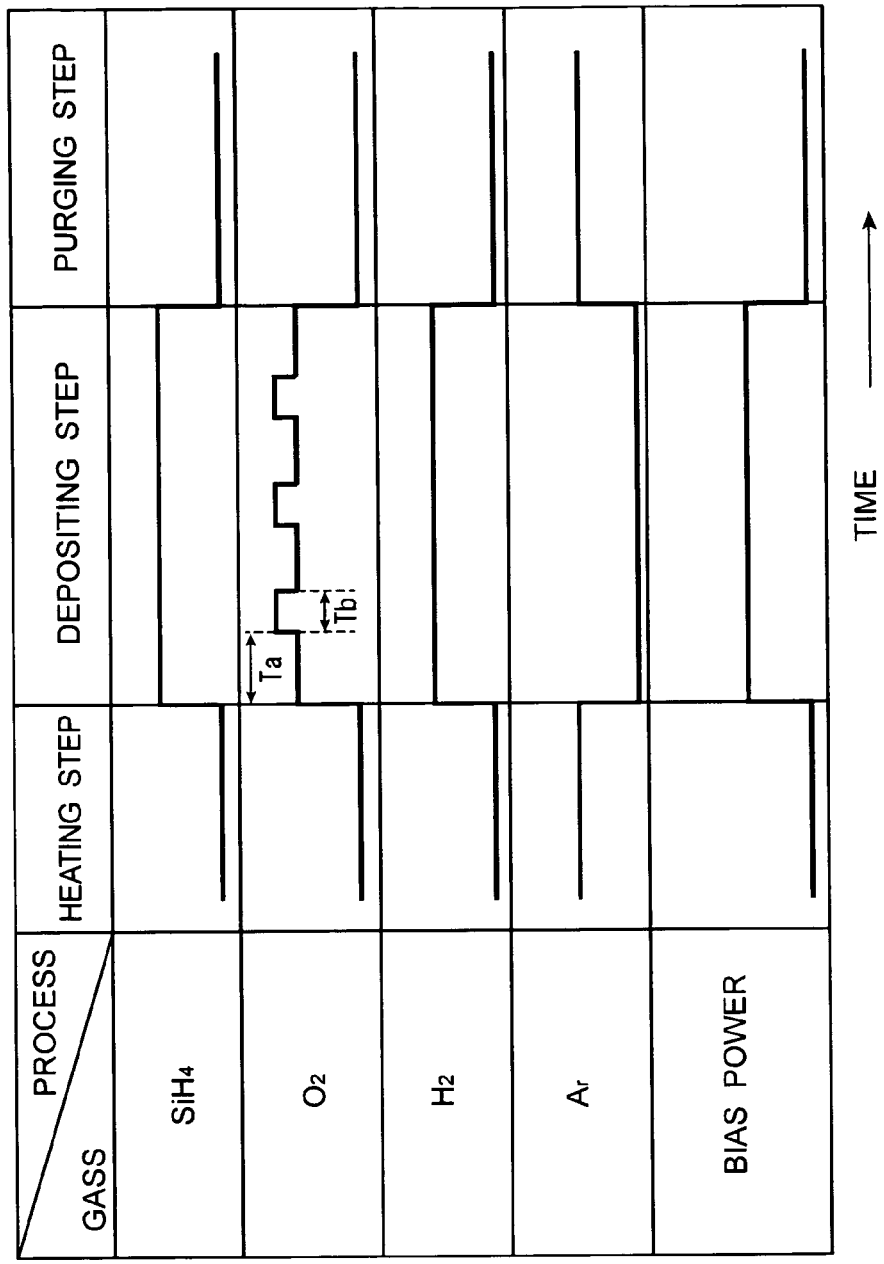
FIG. 6 is a chart of a processing recipe in relation to the first embodiment of the present invention.

In a method of depositing an insulating film according to the embodiment of the invention, a processing recipe is used to introduce process gases into plasma on the cluster formation condition alternating with the cluster suppression condition in the process of deposition as shown in FIG. 6. Thus, such a processing recipe to repeat the cluster formation condition and the cluster suppression condition is written in a program stored in the program memory by using process conditions, such as flow rates of process gases and applied powers, as parameters. In the processing recipe mentioned here, the $O_2$ gas-flow rate is increased from the cluster formation condition, and the first flow-rate ratio on the y-axis is reduced while the second flow-rate ratio on the x-axis is increased. In this manner, the cluster suppression condition is achieved.

For example, the process gases are supplied to reaction chamber 13 during time period Ta of the depositing step (see FIG. 6), for example, on the cluster formation condition with gas-flow rates of about 10 sccm for $SiH_4$, about 22 sccm for $O_2$, and about 700 sccm for $H_2$. Further, a bias power of about 2 to 3 kW is applied to electrode 16 from RF power supply 26. During time period Tb of the depositing step (see FIG. 6), the process gases are supplied to reaction chamber 13 on the cluster suppression condition where the $O_2$ gas-flow rate is increased to about 100 sccm. As shown in FIG. 6, the cluster formation condition during time period Ta and the cluster suppression condition during time period Tb are alternately repeated more than once until a target film thickness of the insulating film is deposited.

It is desirable to deposit the insulating film in the range of thickness from not less than about 50 nm to not more than about 200 nm during time period Ta. Time period Tb is not less than about 1 second but not more than about 10 seconds, and, preferably, not less than about 1 second but not more than about 5 seconds.

Since oxygen (O) concentration in the plasma becomes high during time period Tb, Si clusters formed during time period Ta are oxidized. As a result, it becomes possible to deposit the insulating film while the formation of the Si clusters is suppressed.

If the insulating film thickness deposited during time period Ta is thinner than about 50 nm, that deposited during time period Tb becomes relatively thick, so that the groove-burying property is deteriorated. Thus, a possibility exist in that voids are formed in the insulating film buried in the groove. If the film thickness deposited during time period Ta is thicker than about 200 nm, it becomes impossible to sufficiently oxidize the Si clusters formed during time period Ta. As a result, the Si clusters remain in the insulating film in some cases.

If time period Tb is shorter than about 1 second, it becomes impossible to sufficiently oxidize the Si clusters formed during time period Ta, so that the Si clusters remain in the insulating film in some cases. If the time period Tb is longer than about 10 seconds, the groove-burying property is deteriorated, so that there is the possibility that voids are formed in the insulating film buried in the groove.

Figure 7:
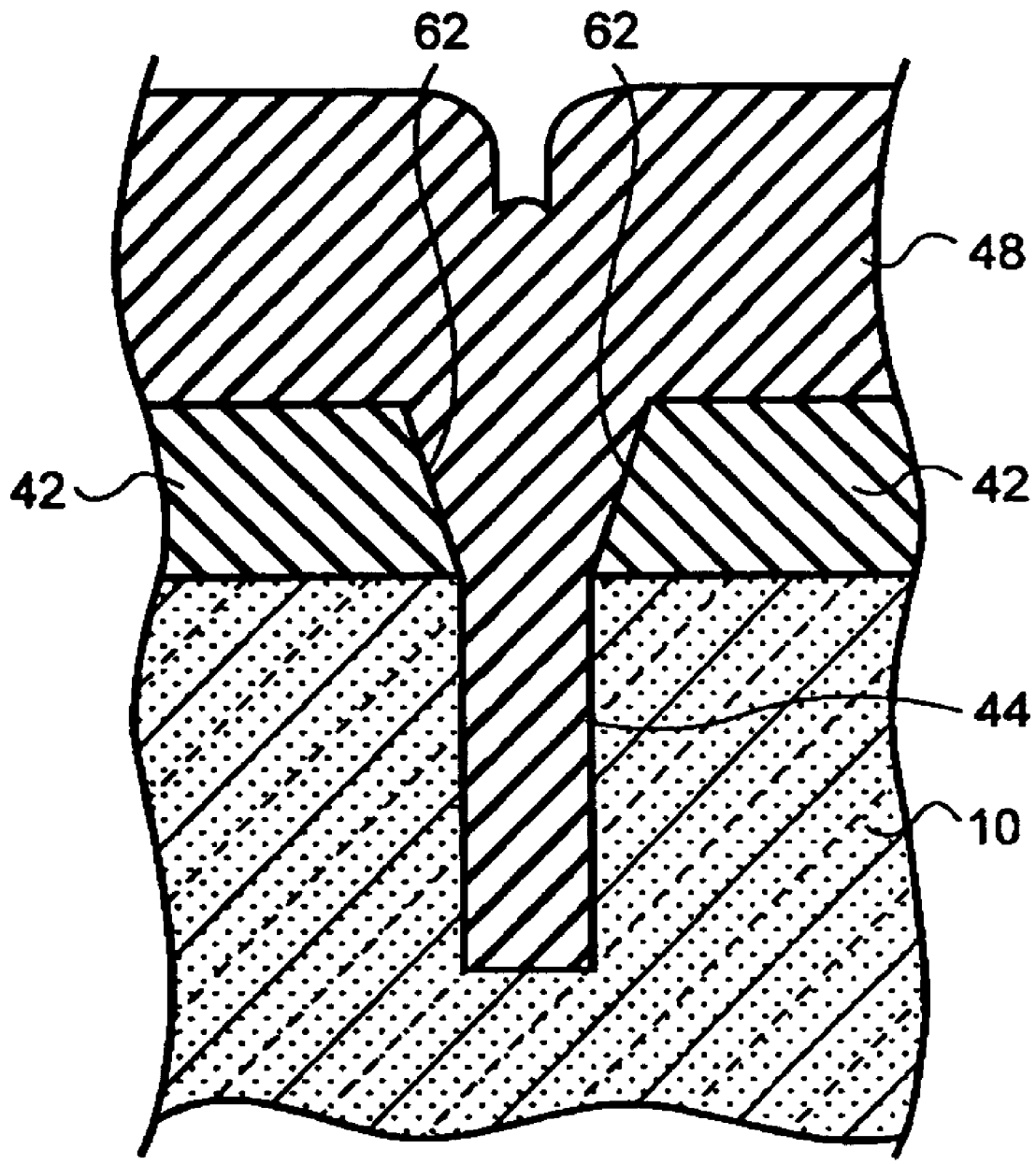
FIG. 7 is a sectional view of a semiconductor substrate on which an insulating film is deposited in response to the processing recipe shown in FIG. 6.

Incidentally, a self-bias voltage is applied between the surface of semiconductor substrate 10 and the plasma to deposit insulating film 48 in the HDP-CVD process while sputtering is carried out for an overhang deposited in a shoulder portion of the groove 44 shown in FIG. 3. If insulating film 48 is formed under the cluster suppression condition, O ions and the like which are larger in mass than H ions relatively increase in the plasma, and consequently, the sputtering speed increases. As a result, as shown in FIG. 7, the shoulder portion of groove 44 is scraped away, and an inclined side wall 62 is formed in protective film 42.

Figure 8:
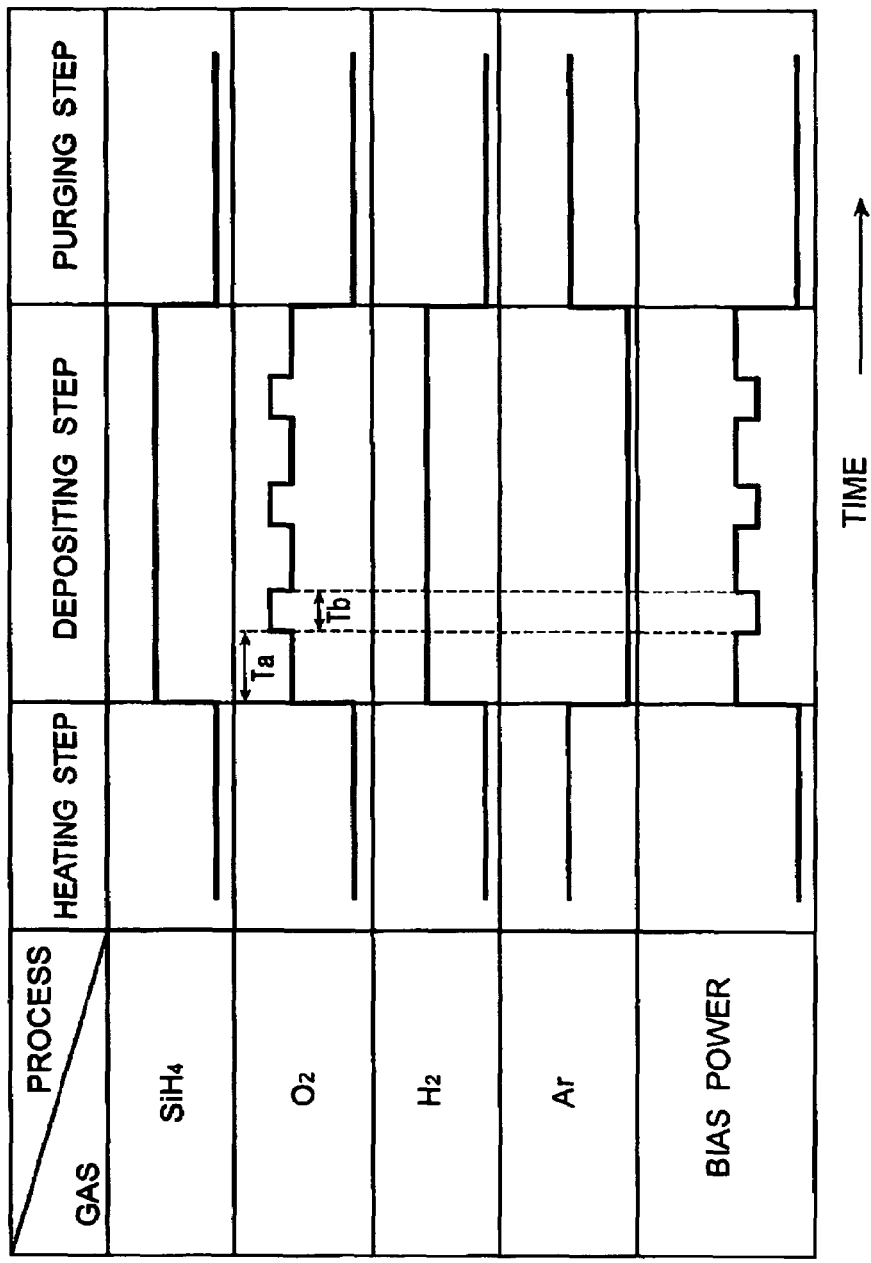
FIG. 8 is a chart of a processing recipe in relation to the second embodiment of the present invention.

For the purpose of preventing the shoulder portion from being scraped away, it is desirable, as shown in FIG. 8, that the bias power be reduced during time period Tb when the deposition is performed under the cluster suppression condition. When the bias power is reduced, the self-bias voltage between semiconductor substrate 10 and the plasma is also reduced, so that the sputtering speed can be lowered. Accordingly, it becomes possible to prevent the shoulder portion of the groove from being scraped away.

Figure 9:
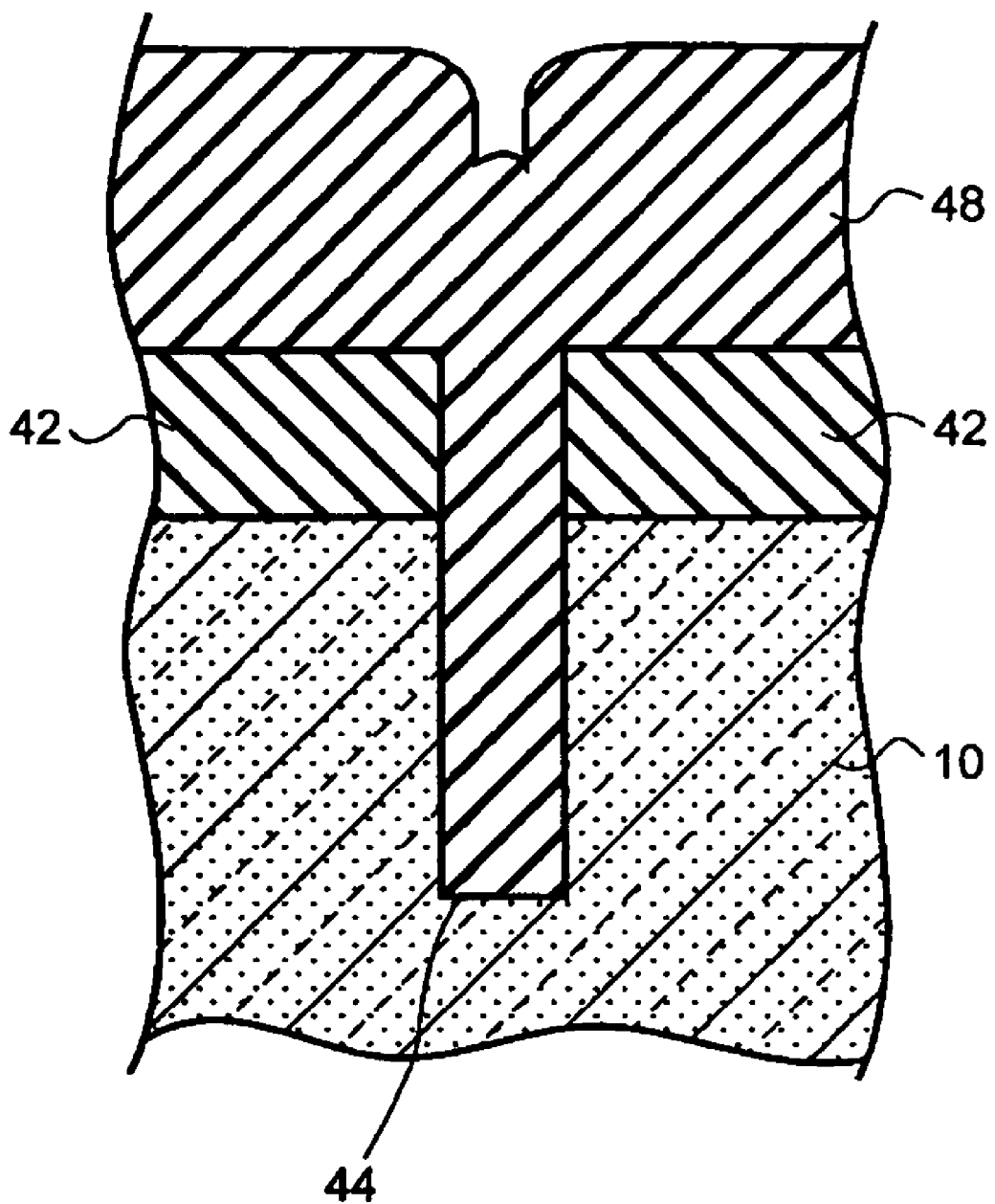
FIG. 9 is a sectional view of a semiconductor substrate on which an insulating film is deposited in response to the processing recipe shown in FIG. 8.

For example, as shown in FIG. 9, insulating film 48 is deposited based on the processing recipe shown in FIG. 8 to fill the groove formed on the semiconductor substrate 10. The cluster formation condition includes gas-flow rates of about 10 sccm for $SiH_4$, about 22 sccm for $O_2$ and about 700 sccm for $H_2$, and a bias power of about 2 to 3 kW. The cluster suppression condition includes gas-flow rates of about 10 sccm for $SiH_4$, about 100 sccm for $O_2$ and about 700 sccm for $H_2$, and a bias power of about 0.5 kW. Voids are not formed in buried insulating film 48 and Si clusters above protective film 42 are not observed either. Further, no scraping is observed at the shoulder portion of protective film 42.

In the method of depositing an insulating film according to the present embodiment of the invention, the process gases are introduced into the plasma under the cluster formation condition which is high in the groove-burying property and alternates with the cluster suppression condition which permits the formed Si clusters to be oxidized. Accordingly, an insulating film can be buried in a groove having an aspect ration of 3.0 or higher while suppressing the formation of voids and Si clusters. Thus, the embodiment of the present invention makes it possible to enhance the groove-burying property, and to suppress quality deterioration of the insulating film. Additionally, the bias power is reduced during time period Tb for the cluster suppression condition. As a result, it becomes possible to deposit the insulating film while preventing the shoulder portion of the groove from being scraped away.

Next, a device-isolation-forming process will be described below as an example of a method of manufacturing a semiconductor device according to the embodiment of the present invention.

Figure 10:
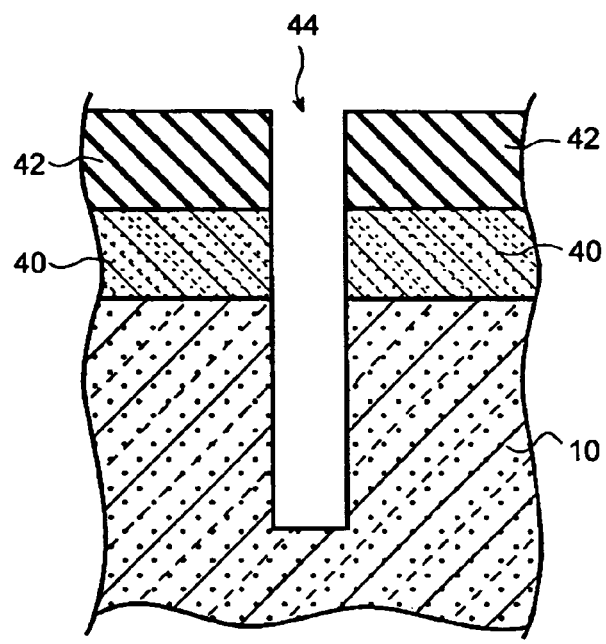
FIG. 10 is a sectional view of a semiconductor substrate processed by the first step of a method of manufacturing a semiconductor device in accordance with an embodiment of the present invention.

(I) A CVD method or the like is carried out to form an insulating film (not illustrated) on Si semiconductor substrate 10, conductive film 40 of polycrystalline (poly) silicon as a gate electrode material on the insulating film, and then protective film 42 such as $Si_3N_4$ on conductive film 40 as shown in FIG. 10. Techniques, such as photolithography and radical ion etching (RIE), are applied to make device isolation groove 44 with an aspect ratio of about 7.0 or higher, for example, in semiconductor substrate 10.

Figure 11:
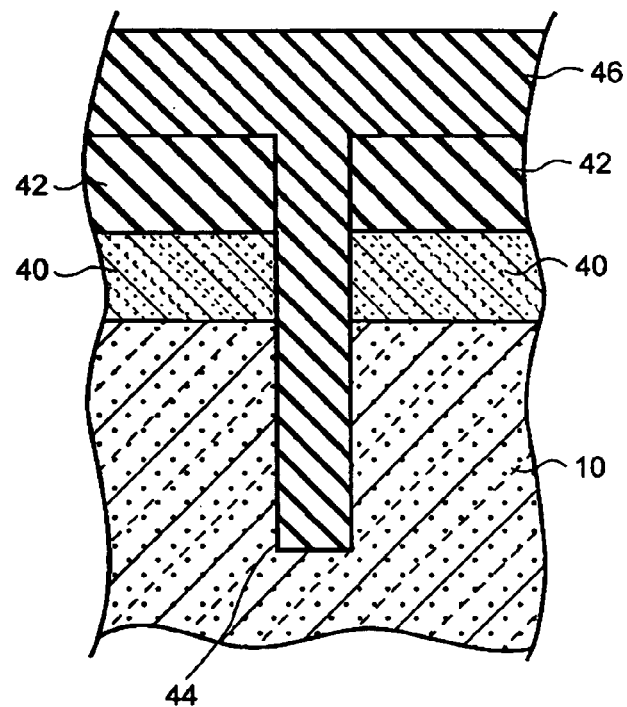
FIG. 11 is a sectional view of a semiconductor substrate processed by the second step of the method of manufacturing the semiconductor device in accordance with the embodiment of the present invention.

(II) As shown in FIG. 11, coating-type insulating film 46 of polysilazane $SiO_2$ or the like is coated on protective film 42 provided for semiconductor substrate 10 and conductive film 40 while coating-type insulating film 46 is filled in the inside of groove 44.

Figure 12:
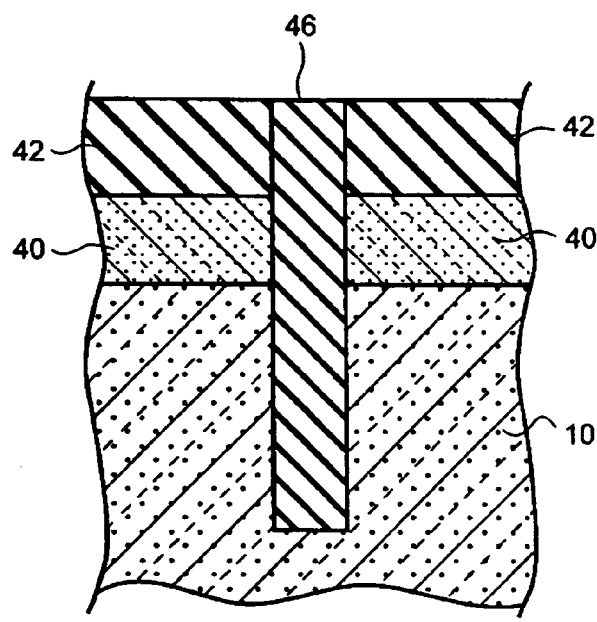
FIG. 12 is a sectional view of a semiconductor substrate processed by the third step of the method of manufacturing the semiconductor device in accordance with the embodiment of the present invention.

(III) As shown in FIG. 12, coating-type insulating film 46 is polished and planarized by means of CMP process or the like until a top surface of protective film 42 is exposed.

Figure 13:
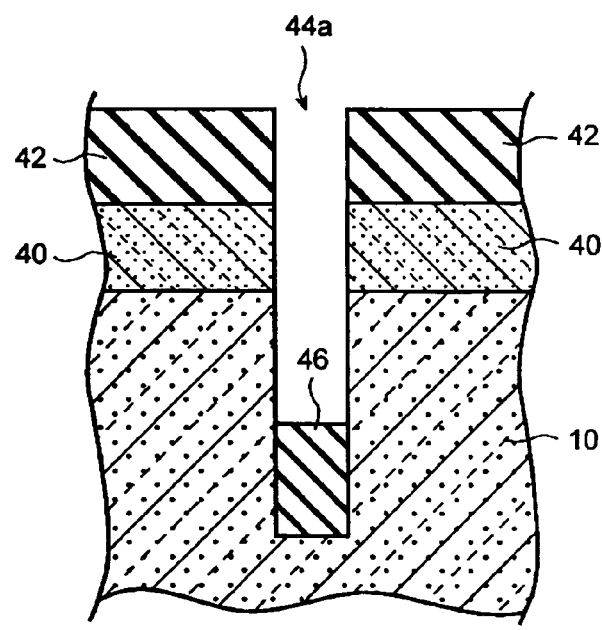
FIG. 13 is a sectional view of a semiconductor substrate processed by the fourth step of the method of manufacturing the semiconductor device in accordance with the embodiment of the present invention;.

(IV) As shown in FIG. 13, wet-etching or the like is applied to selectively remove coating-type insulating film 46 but leaves the same partially in a bottom portion of groove 44a. A top surface of coating-type insulating film 46 is set back inside semiconductor substrate 10 to make an aspect ratio of groove 44a less than about 7.0:1, for example, about 5:1.

Figure 14:
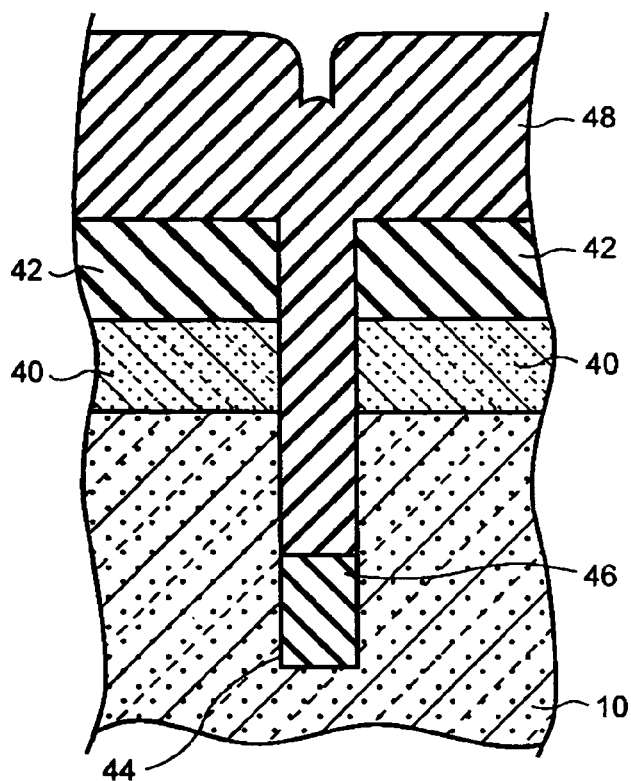
FIG. 14 is a sectional view of a semiconductor substrate processed by the fifth step of the method of manufacturing the semiconductor device in accordance with the embodiment of the present invention.

(V) Semiconductor substrate 10 is mounted on electrode 16 inside reaction chamber 13 of the PCVD apparatus shown in FIG. 1. As shown in FIG. 14, the HDP-CVD method or the like is carried out to repeat the step of introducing the process gases under the cluster formation condition or alternatively under the cluster suppression condition to bury insulating film 48 made of $SiO_2$ or the like in the groove 44a.

Figure 15:
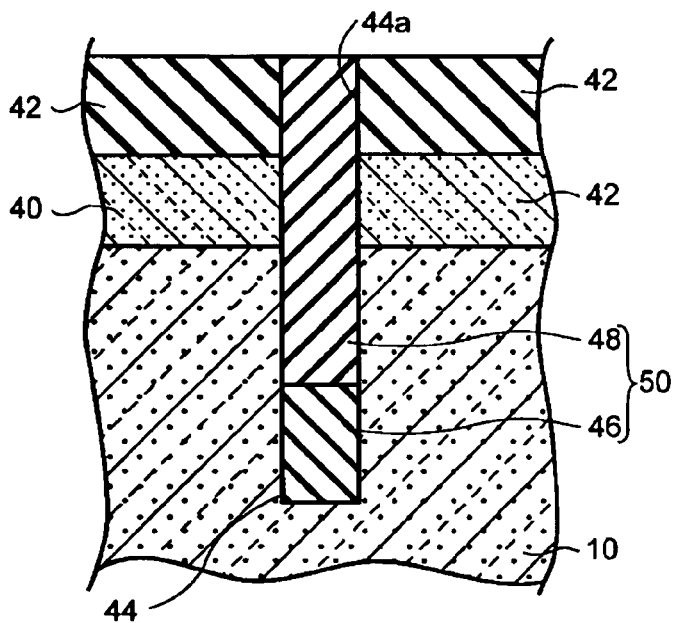
FIG. 15 is a sectional view of a semiconductor substrate processed by the sixth step of the method of manufacturing the semiconductor device in accordance with the embodiment of the present invention.

(VI) As shown in FIG. 15, the CMP process or the like is applied to polish and planarize insulating film 48 until the top surface of protective film 42 is exposed. Thus, device isolation region 50 including coating-type insulating film 46 and insulating film 48 is formed.

Specifically, the HDP-CVD method is carried out in accordance with the processing recipe shown in FIG. 8. For example, Ar gas is introduced into reaction chamber 13 (see FIG. 1) from gas delivery system 28 through supply line 29 via nozzles 20a and 20b. An RF power is supplied to antenna 18 from RF power supply 24 to generate Ar plasma inside the ceramic dome portion 12, which heats semiconductor substrate 10.

The supply of Ar gas is then stopped. During time period Ta, process gases are supplied to reaction chamber 13 under the cluster formation condition with gas-flow rates of about 10 sccm for $SiH_4$, about 22 sccm for $O_2$, and about 700 sccm for $H_2$. Further, a bias power of about 2 to 3 kW is applied to electrode 16 from RF power supply 26. Plasma-excitation RF power is supplied to antenna 18 from RF power supply 24. During time period Tb, the bias power is reduced to about 0.5 kW under the cluster suppression condition with an increased gas-flow rate of about 100 sccm for $O_2$. Time periods Ta and Tb are alternately repeated until the insulating film is deposited in a desired film thickness.

The supply of the process gases of $SiH_4$, $O_2$, and $H_2$, the bias power, along with the plasma excitation RF power is then stopped. The Ar gas is again introduced in order to purge the inside of reaction chambers 13.

In the method for manufacturing a semiconductor device according to the embodiment of the present invention, the insulating film 48 is formed by introducing the process gases into the plasma under the cluster formation condition which is high in the groove-burying property and alternates with the cluster suppression condition which permits the formed Si clusters to be oxidized. Accordingly, it is possible to bury insulating film 48 in groove 44a while suppressing the formation of voids and Si clusters. Thus, this embodiment of the present invention can enhance the groove-burying property, and also suppress quality deterioration of the insulating film. Further, since the bias power is reduced during the deposition under the cluster suppression condition, it can prevent the shoulder portion of protective film 42 from being scraped away.

Further, existing HDP-CVD techniques deteriorate an insulating film burying property in a groove with a high aspect ratio of about 7.0 or higher. In the embodiment of the present invention, coating-type insulating film 46 is buried in the bottom portion of groove 44 so that the aspect ratio of groove 44a may be set to about 5.0:1. Therefore, insulating film 48 can be deposited while suppressing deterioration of the groove-burying property.

Incidentally, an insulating property of a coating-type insulating m is generally inferior to that of a CVD insulating film and the like. In the embodiment of the present invention, however, conductive film 40 and semiconductor substrate 10 contiguous to conductive film 40 are separated from each other by insulating film 48 deposited while suppressing the formation of Si clusters. As a result, it makes possible to prevent device isolation region 50 from deteriorating in insulating property.

In the description of the aforementioned embodiment, the cluster suppression condition is achieved by increasing only the $O_2$ gas-flow rate from the cluster formation condition. However, a method for changing from the cluster formation condition to the cluster suppression condition is not limited to the method set forth above but may be a method for changing a flow rate of another process gas.

Figure 16:
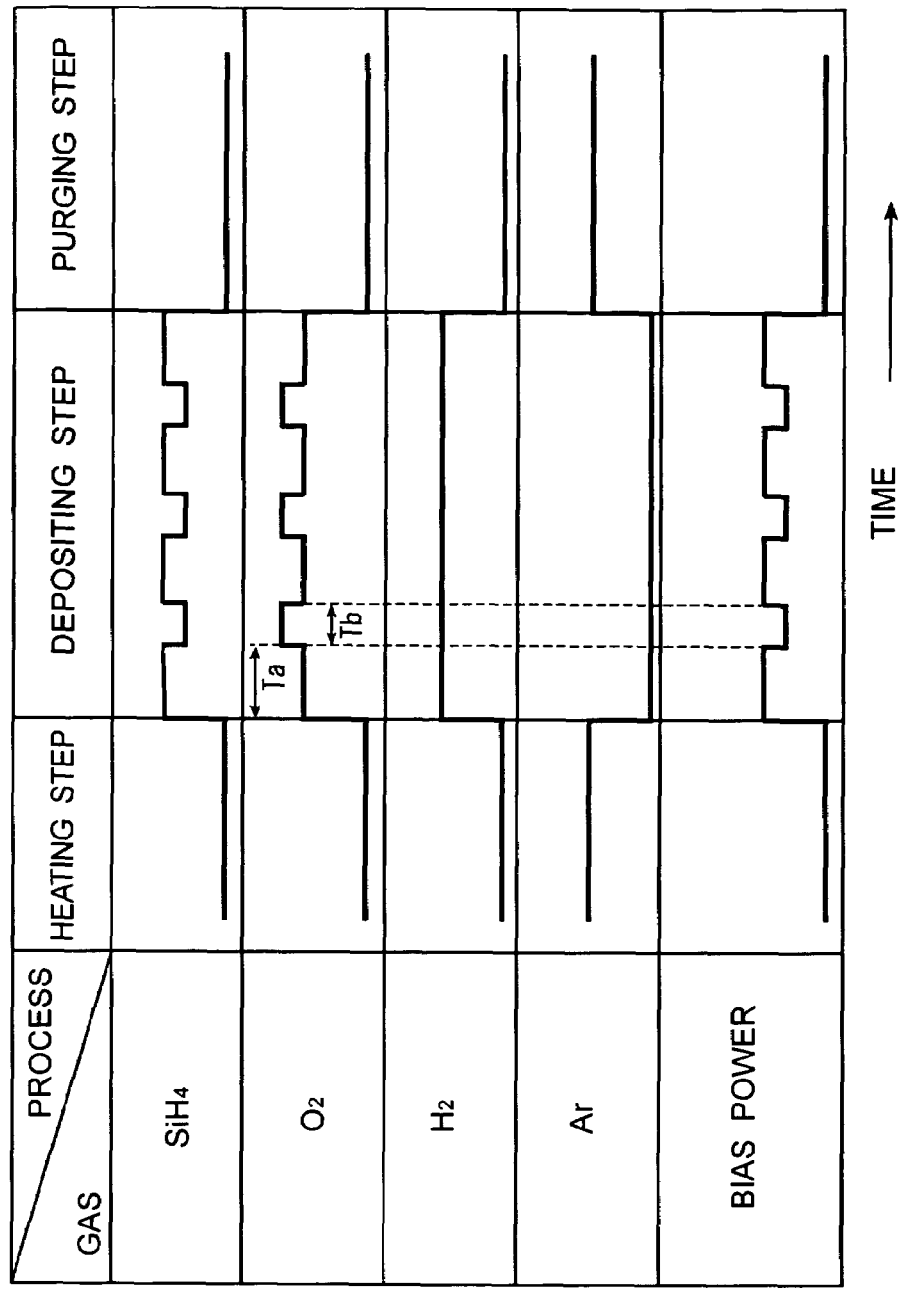
FIGS. 16-18 are processing recipes in relation to other embodiments of the present invention.

For example, as shown in FIG. 16, the cluster suppression condition may be changed from the cluster formation condition through the decrease of the $SiH_4$ gas-flow rate and the increase of the $O_2$ gas-flow rate during time period Tb. More specifically, a bias power during time period Ta is set to about 2 to 3 kW under the cluster formation condition with gas-flow rates of about 10 sccm for $SiH_4$, about 22 sccm for $O_2$, and about 700 sccm for $H_2$. During time period Tb, however, the bias power is changed to about 0.5 kW under the cluster suppression condition with gas-flow rates of about 3 sccm for $SiH_4$, about 100 sccm for $O_2$, and about 700 sccm for $H_2$.

Since the $SiH_4$ gas-flow rate is decreased while the $O_2$ gas-flow rate is increased, oxidation capability is increased. As a result, it becomes possible to deposit an insulating-property-enhanced insulating film resulting from the suppression of the formation of Si clusters. Further, the $SiH_4$ gas-flow rate may be set to zero for further enhancement of the oxidation capability. In this case, the Si clusters formed during preceding time period Ta are only oxidized but no deposition is carried out during time period Tb.

Figure 17:
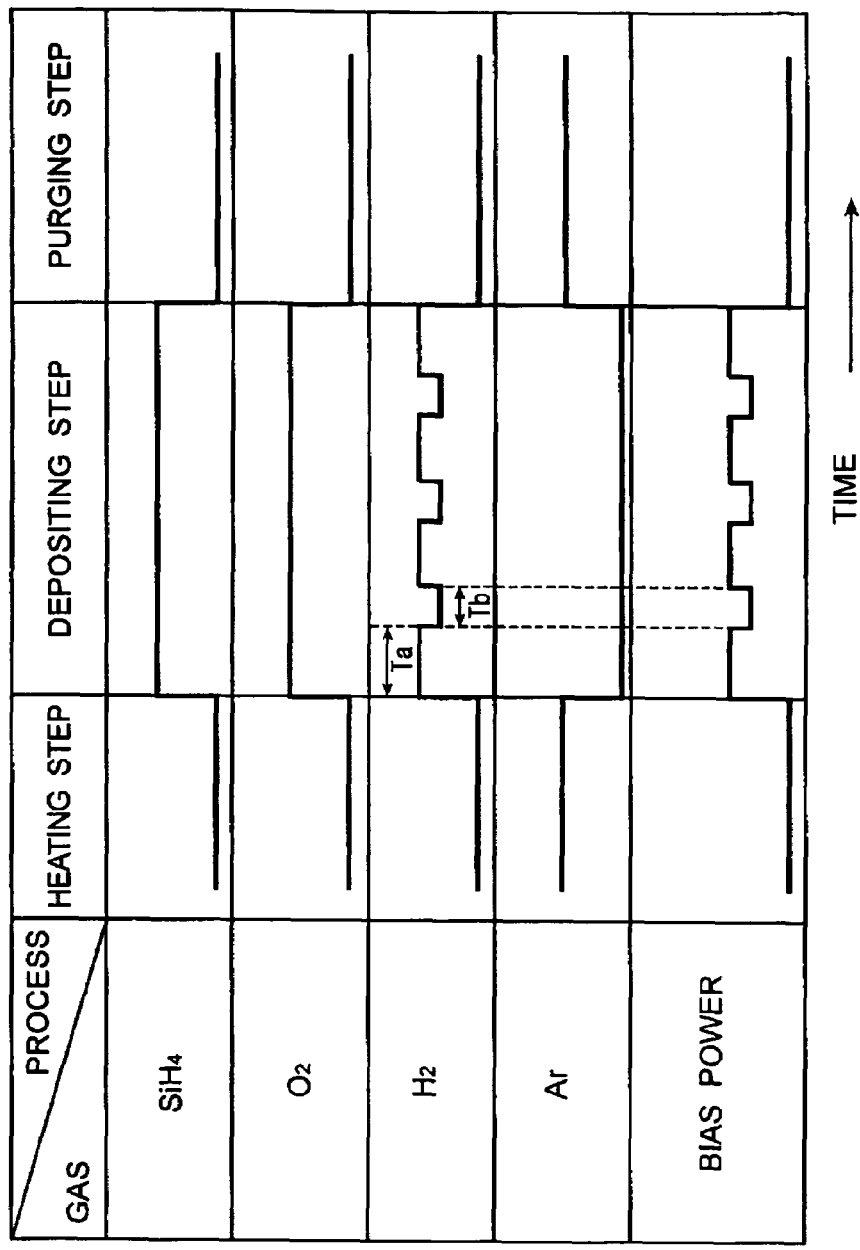

Alternatively, as shown in FIG. 17, the cluster suppression condition may be set up to the decrease of the $H_2$ gas-flow rate from the cluster formation condition during time period Tb. More specifically, a bias power during time period Ta is set to about 2 to 3 kW under the cluster formation condition with gas-flow rates of about 10 sccm for $SiH_4$, about 22 sccm for $O_2$, and about 700 sccm for $H_2$. During time period Tb, however, the bias power is changed to about 0.5 kW under the cluster suppression condition with gas-flow rates of about 10 sccm for $SiH_4$, about 22 sccm for $O_2$, and about 200 sccm for $H_2$, respectively.

The decrease of the $H_2$ gas-flow rate results in a decrease of the first flow rate ratio to change the cluster formation condition to the cluster suppression condition. Thus, it becomes possible to suppress the formation of Si clusters. Here, an increase in $O_2$ gas-flow rate may be combined with a decrease in $H_2$ gas-flow rate to change the cluster formation condition to the cluster suppression condition.

Figure 18:
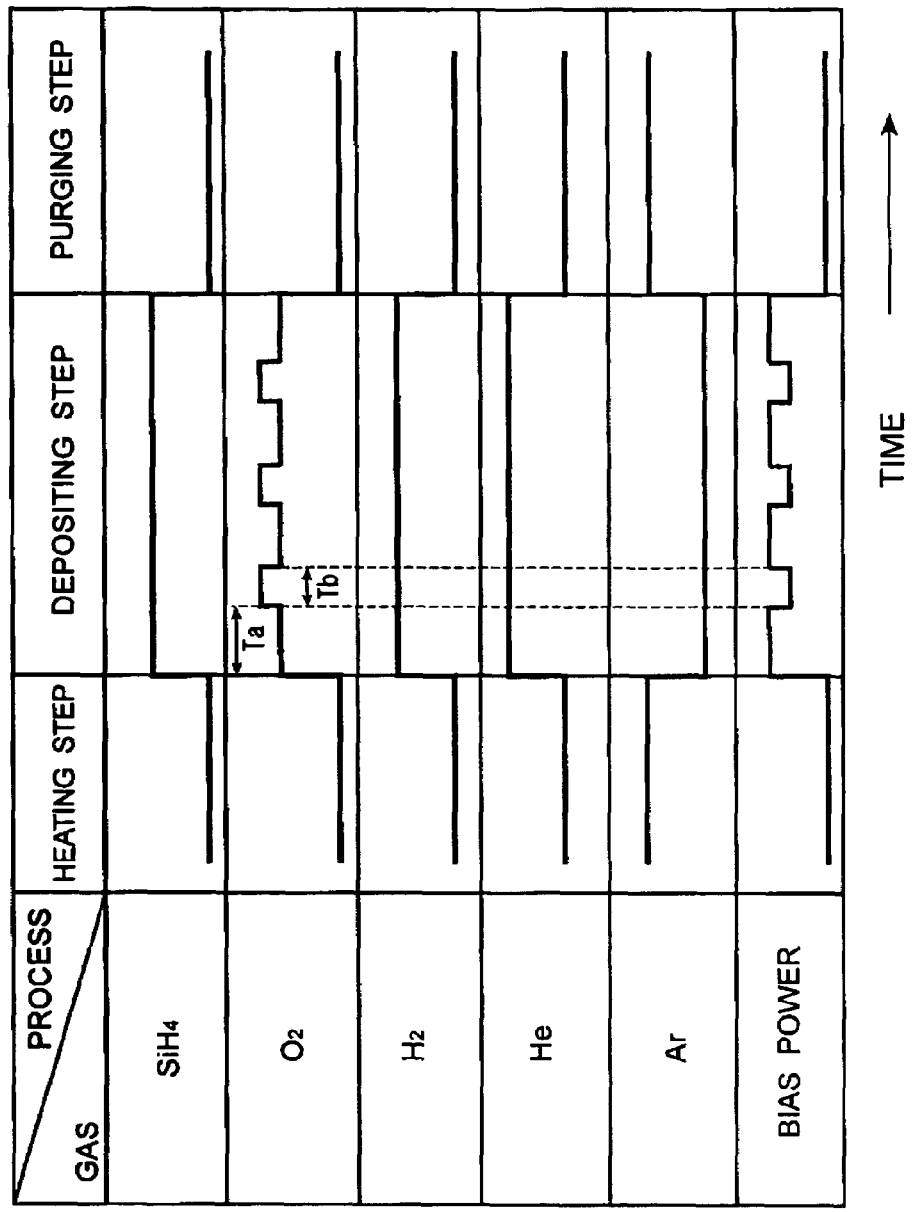

Furthermore, decreases in gas-flow rates for $SiH_4$ along with $H_2$ from the cluster formation condition during time period Tb may achieve the cluster suppression condition. In this case, the gas-flow rate for $SiH_4$ or $H_2$ may be set to zero. In consideration of suppressing pressure fluctuation inside the reaction chamber, however, flow rate conditions of the process gases are set up to supply at least one of the gases $SiH_4$ and $H_2$ even after the cluster formation condition is changed to the cluster suppression condition. Additionally, as shown in FIG. 18, helium (He) gas may be included as a process gas. More specifically, the bias power during time period Ta is set to about 2 to 3 kW under the cluster formation condition with gas-flow rates of about 10 sccm for $SiH_4$, about 22 sccm for $O_2$, about 700 sccm for $H_2$ and about 200 sccm for He. During time period Tb, however, the bias power is changed to about 0.5 kW under the cluster suppression condition with gas-flow rates of about 10 sccm for $SiH_4$, about 100 sccm for $O_2$, about 700 sccm for $H_2$ and about 200 sccm for He.

The He gas enhances the groove-burying property as the $O_2$ gas does. Thus, it becomes possible to bury an insulating film even in a relatively narrow size, high aspect ratio groove while suppressing the formation of voids. Incidentally, each of the processing recipes shown in FIGS. 16 and 17 to which He gas is added as a process gas may also enhance a groove-burying property.

OTHER EMBODIMENTS

In the aforementioned embodiments of the present invention, although the description is directed to the process of burying an insulating film in a device isolation groove made in a semiconductor substrate, the burying of an insulating film in a groove is not limited to that for the device isolation. For example, the burying process for an isolating film in a groove may be for the formation of an insulating film such as an intermetal dielectric (IMD) film, a premetal dielectric (PMD) film, etc. which are buried in a groove formed between wiring layers on a semiconductor substrate.

Although the $SiO_2$ film has been described as an insulting film deposited in the PCVD method, the insulating film is not limited to the $SiO_2$ film. For example, the PCVD method may be configured to deposit an insulating film of phosphosilicate glass (PSG), boron-silicate glass (BSG), boron-phosphosilicate glass (BPSG), silicon oxynitride (SiON) or the like.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. A method of forming an insulating film to fill a gap formed in a processed substrate placed in a reaction chamber in which plasma is generated, the method comprising:

introducing first process gases including an oxygen containing gas, a silicon containing gas and a hydrogen containing gas into the reaction chamber under a cluster formation condition set up with respect to a critical condition; and introducing second process gases including a silicon containing gas, and at least one of an oxygen containing gas and a hydrogen containing gas into the reaction chamber under a cluster suppression condition set up with respect to the critical condition, wherein a ratio of a gas flow of the hydrogen containing gas except the silicon containing gas to a total gas flow of the silicon containing gas and the oxygen containing gas defines a first gas-flow ratio, a ratio of a gas flow of the oxygen containing gas to that of the silicon containing gas defines a second gas-flow ratio, the critical condition is a linear function defined by the first and second gas-flow ratios, the cluster formation condition is set by gas flows which relatively increase the first gas-flow ratio but relatively decrease the second gas-flow ratio, and the cluster suppression condition is set by gas flows which relatively decrease the first gas-flow ratio but relatively increase the second gas-flow ratio.

2. The method of claim 1, further comprising:
supplying a first bias power to the substrate to apply a self-bias voltage between the substrate and the plasma when the first process gases are introduced into the reaction chamber under the cluster formation condition; and supplying the substrate with a second bias power that is smaller in power than the first bias power when the first process gases are introduced into the reaction chamber under the cluster suppression condition.

3. The method of claim 1, wherein the first and second gas-flow ratios are denoted by "y" and "x", respectively,
the cluster formation condition is expressed by an inequality of $y \geq 16x-18$, and
the cluster suppression condition is expressed by an inequality of $y < 16x-18$.

4. The method of claim 1, wherein the insulating film is formed with a thickness ranging from not thinner than 50 nm to not thicker than 200 nm during a period of time when the first process gases are introduced into the reaction chamber under the cluster suppression condition.

5. The method of claim 1, wherein the second process gases are introduced into the reaction chamber for a period of time which is not shorter than 1 second but not longer than 10 seconds under the cluster suppression condition.

6. The method of claim 1, wherein the cluster suppression condition is achieved by increasing the flow of the oxygen containing gas from the cluster formation condition.

7. The method of claim 1, wherein the cluster suppression condition is achieved by decreasing the flow of the hydrogen containing gas from the cluster formation condition.

8. The method of claim 1, wherein the cluster suppression condition is achieved by increasing the flow of the oxygen containing gas while decreasing the flow of the hydrogen containing gas from the cluster formation condition.

9. The method of claim 1, wherein the first and second process gasses are alternately introduced into the reaction chamber under the cluster formation condition and the cluster suppression condition, respectively.

10. A method of manufacturing a semiconductor device, comprising:
making a groove in a semiconductor substrate;
placing the semiconductor substrate in a reaction chamber where plasma is generated; and
burying an insulating film in the groove, the insulating groove being formed by introducing first process gases including a silicon containing gas, an oxygen containing gas and a hydrogen containing gas into the reaction chamber under a cluster formation condition set up with respect to a critical condition, and
introducing second process gases including a silicon containing gas, and at least one of an oxygen containing gas and a hydrogen containing gas into the reaction chamber under a cluster suppression condition set up with respect to the critical condition, wherein a ratio of a gas flow of the hydrogen containing gas except the silicon containing gas to a total gas flow of the silicon containing gas and the oxygen containing gas defines a first gas-flow ratio, a ratio of a gas flow of the oxygen containing gas to that of the silicon containing gas defines a second gas-flow ratio, the critical condition is a linear function defined by the first and second gas-flow ratios, the cluster formation condition is set by gas flows which relatively increase the first gas-flow ratio but relatively decrease the second gas-flow ratio, and the cluster suppression condition is set by gas flows which relatively decrease the first gas-flow ratio but relatively increase the second gas-flow ratio.

11. The method of claim 10, further comprising:
supplying a first bias power to the substrate to apply a self-bias voltage between the substrate and the plasma when the first process gases are introduced into the reaction chamber under the cluster formation condition; and supplying the substrate with a second bias power that is smaller in power than the first bias power when the first process gases are introduced into the reaction chamber under the cluster suppression condition.

12. The method of claim 10, wherein the first and second gas-flow ratios are denoted by "y" and "x", respectively,
the cluster formation condition is expressed by an inequality of $y \geq 16x-18$, and
the cluster suppression condition is expressed by an inequality of $y < 16x-18$.

13. The method of claim 10, wherein the insulating film is formed with a thickness ranging from not thinner than 50 nm to not thicker than 200 nm during a period of time when the first process gases are introduced into the reaction chamber under the cluster suppression condition.

14. The method of claim 10, wherein the second process gases are introduced into the reaction chamber for a period of time which is not shorter than 1 second but not longer than 10 seconds under the cluster suppression condition.

15. The method of claim 10, wherein the cluster suppression condition is achieved by increasing the flow of the oxygen containing gas from the cluster formation condition.

16. The method of claim 10, wherein the cluster suppression condition is achieved by decreasing the flow of the hydrogen containing gas from the cluster formation condition.

17. The method of claim 10, wherein the cluster suppression condition is achieved by increasing the flow of the oxygen containing gas while decreasing the flow of the hydrogen containing gas from the cluster formation condition.

18. The method of claim 10, wherein the first and second process gasses are alternately introduced into the reaction chamber under the cluster formation condition and the cluster suppression condition, respectively.

19. The method of claim 10, further comprising burying a bottom of the groove with a coating-type insulating film before burying the insulating film in the groove.

20. A computer control program for a plasma chemical vapor deposition apparatus, executing the operations of:
introducing first process gases including a silicon containing gas, an oxygen containing gas and a hydrogen containing gas into a reaction chamber under a cluster formation condition set up with respect to a critical condition; and
introducing second process gases including an oxygen containing gas, and at least one of a silicon containing gas and a hydrogen containing gas into the reaction chamber under a cluster suppression condition set up with respect to the critical condition, wherein a ratio of a gas flow of the hydrogen containing gas except the silicon containing gas to a total gas flow of the silicon containing gas and the oxygen containing gas defines a first gas-flow ratio, a ratio of a gas flow of the oxygen containing gas to that of the silicon containing gas defines a second gas-flow ratio, the critical condition is a linear function defined by the first and second gas-flow ratios, the cluster formation condition is set by gas flows which relatively increase the first gas-flow ratio but relatively decrease the second gas-flow ratio, and the cluster suppression condition is set by gas flows which relatively decrease the first gas-flow ratio but relatively increase the second gas-flow ratio.

* * * * *